United States Patent
Straka et al.

(10) Patent No.: US 8,272,902 B2
(45) Date of Patent: *Sep. 25, 2012

(54) COMMUNICATIONS CONNECTOR WITH MULTI-STAGE COMPENSATION

(75) Inventors: Frank M. Straka, Chicago, IL (US); Michael K. Yuan, Joliet, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/080,359

(22) Filed: Apr. 5, 2011

(65) Prior Publication Data

US 2011/0183547 A1   Jul. 28, 2011

Related U.S. Application Data

(63) Continuation of application No. 12/540,891, filed on Aug. 13, 2009, now Pat. No. 7,927,153.

(60) Provisional application No. 61/088,548, filed on Aug. 13, 2008.

(51) Int. Cl.
    *H01R 24/00* (2011.01)

(52) U.S. Cl. .................................... 439/676

(58) Field of Classification Search .............. 439/676, 439/941
    See application file for complete search history.

(56) References Cited

U.S. PATENT DOCUMENTS

| | | |
|---|---|---|
| 5,186,647 A | 2/1993 | Denkmann et al. |
| 5,299,956 A | 4/1994 | Brownell et al. |
| 5,326,284 A | 7/1994 | Bohbot et al. |
| 5,362,254 A | 11/1994 | Siemon et al. |
| 5,454,738 A | 10/1995 | Lim et al. |
| 5,470,244 A | 11/1995 | Lim et al. |
| 5,513,065 A | 4/1996 | Caveney et al. |
| 5,618,185 A | 4/1997 | Aekins |
| 5,700,167 A | 12/1997 | Pharney et al. |
| 5,797,764 A | 8/1998 | Coulombe et al. |
| 5,911,602 A | 6/1999 | Vaden |
| 5,940,959 A | 8/1999 | Caveney et al. |
| 5,967,853 A | 10/1999 | Hashim |
| 5,997,358 A | 12/1999 | Adriaenssens et al. |
| 6,017,247 A | 1/2000 | Gwiazdowski |
| 6,089,923 A | 7/2000 | Phommachanh |
| 6,106,335 A | 8/2000 | Merchant et al. |
| 6,120,330 A | 9/2000 | Gwiazdowski |
| 6,176,742 B1 | 1/2001 | Arnett et al. |
| 6,186,834 B1 | 2/2001 | Anrett et al. |
| 6,196,880 B1 | 3/2001 | Goodrich et al. |
| 6,231,397 B1 | 5/2001 | De La Borbolla et al. |
| 6,305,950 B1 | 10/2001 | Doorhy |
| 6,319,069 B1 | 11/2001 | Gwiazdowski |
| 6,350,158 B1 | 2/2002 | Arnett et al. |
| 6,402,560 B1 | 6/2002 | Lin |

(Continued)

FOREIGN PATENT DOCUMENTS

EP   0854664 A1   7/1998

(Continued)

*Primary Examiner* — Tho D Ta

(74) *Attorney, Agent, or Firm* — Robert A. McCann; Christopher S. Clancy; Christopher K. Marlow

(57) ABSTRACT

A communication connector uses compensation circuitry to compensate for crosstalk in a network connection. Capacitors are connected between specific conducive paths in said communication connector. Inductive stubs are utilized in the compensation circuitry to improve the overall compensation performance.

6 Claims, 7 Drawing Sheets

TG JACK ASSEMBLY EXPLODED VIEW

CAT6 TG JACK RIGID BOARD SCHEMATIC

U.S. PATENT DOCUMENTS

| | | |
|---|---|---|
| 6,409,547 B1 | 6/2002 | Reede |
| 6,483,715 B1 | 11/2002 | Chen |
| 6,533,618 B1 | 3/2003 | Aekins |
| 6,722,894 B2 | 4/2004 | Burmeister |
| 6,866,548 B2 | 3/2005 | Hashim |
| 7,153,168 B2 | 12/2006 | Caveney et al. |
| 7,179,131 B2 | 2/2007 | Caveney et al. |
| 7,182,649 B2 | 2/2007 | Caveney et al. |
| 7,252,554 B2 | 8/2007 | Caveney et al. |
| 7,281,957 B2 | 10/2007 | Caveney |
| 7,309,261 B2 | 12/2007 | Caveney et al. |
| 7,384,315 B2 | 6/2008 | Caveney et al. |
| 7,442,092 B2 | 10/2008 | Caveney et al. |
| 7,452,246 B2 | 11/2008 | Caveney et al. |
| 7,481,681 B2 | 1/2009 | Caveney et al. |
| 7,520,784 B2 | 4/2009 | Caveney et al. |
| 7,561,005 B2 | 7/2009 | Harada et al. |
| 7,576,627 B2 | 8/2009 | Shastry et al. |
| 7,591,689 B2 | 9/2009 | Caveney et al. |
| 7,618,296 B2 | 11/2009 | Caveney |
| 7,927,153 B2 * | 4/2011 | Straka et al. ............ 439/676 |
| 2002/0171505 A1 | 11/2002 | Aekins et al. |
| 2005/0009382 A1 | 1/2005 | Burmeister et al. |
| 2007/0238366 A1 | 10/2007 | Hammond, Jr. et al. |
| 2007/0238367 A1 | 10/2007 | Hammond, Jr. et al. |
| 2009/0163084 A1 | 6/2009 | Straka et al. |

FOREIGN PATENT DOCUMENTS

| | | |
|---|---|---|
| EP | 1246318 A2 | 10/2002 |
| WO | 2004047240 A2 | 6/2004 |
| WO | 2005010579 A1 | 10/2005 |

* cited by examiner

CAT6 TG JACK RIGID BOARD SCHEMATIC

ISOMETRIC VIEW OF RIGID BOARD PCB ARTWORK

EFFECT OF NOSE 12 IGNORED

EXAMPLE OF COMPENSATION AND LATTICE FOR PAIR COMBINATION 45-36

SCHEMATIC FOR PAIR COMBINATION 45-78

SCHEMATIC FOR PAIR COMBINATION 45-12

SCHEMATIC FOR PAIR COMBINATION 45-36

SCHEMATIC FOR PAIR COMBINATION 36-12

SCHEMATIC FOR PAIR COMBINATION 45-36

COMMUNICATIONS CONNECTOR WITH MULTI-STAGE COMPENSATION

CROSS-REFERENCE TO RELATED APPLICATIONS

This application is a continuation of U.S. patent application Ser. No. 12/540,891, filed Aug. 13, 2009, which claims the benefit of U.S. Provisional Application Ser. No. 61/088,548, filed Aug. 13, 2008 and is incorporated herein in its entirety.

BACKGROUND

There is a need to improve near-end crosstalk NEXT performance of communications connectors at higher frequencies in a robust design that can be relatively easily manufactured. This description is directed to a method of improving NEXT performance in a communication connector by employing specific capacitive and inductive couplings on a printed circuit board (PCB) within the connector.

DESCRIPTION OF THE INVENTION

Figure 1:
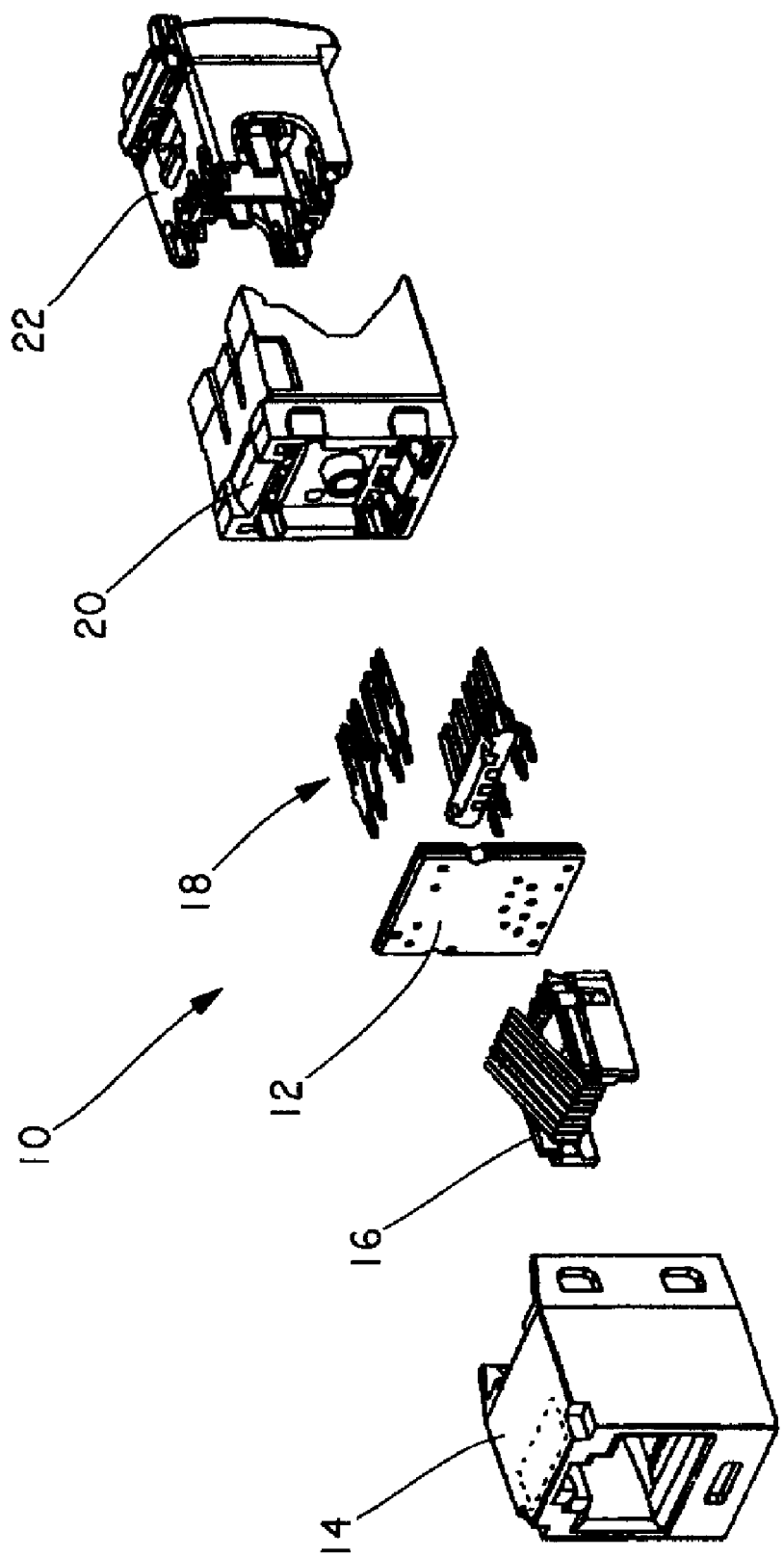
FIG. 1 is an exploded view of a modular jack assembly according to one embodiment of the present invention.
Figure 2:
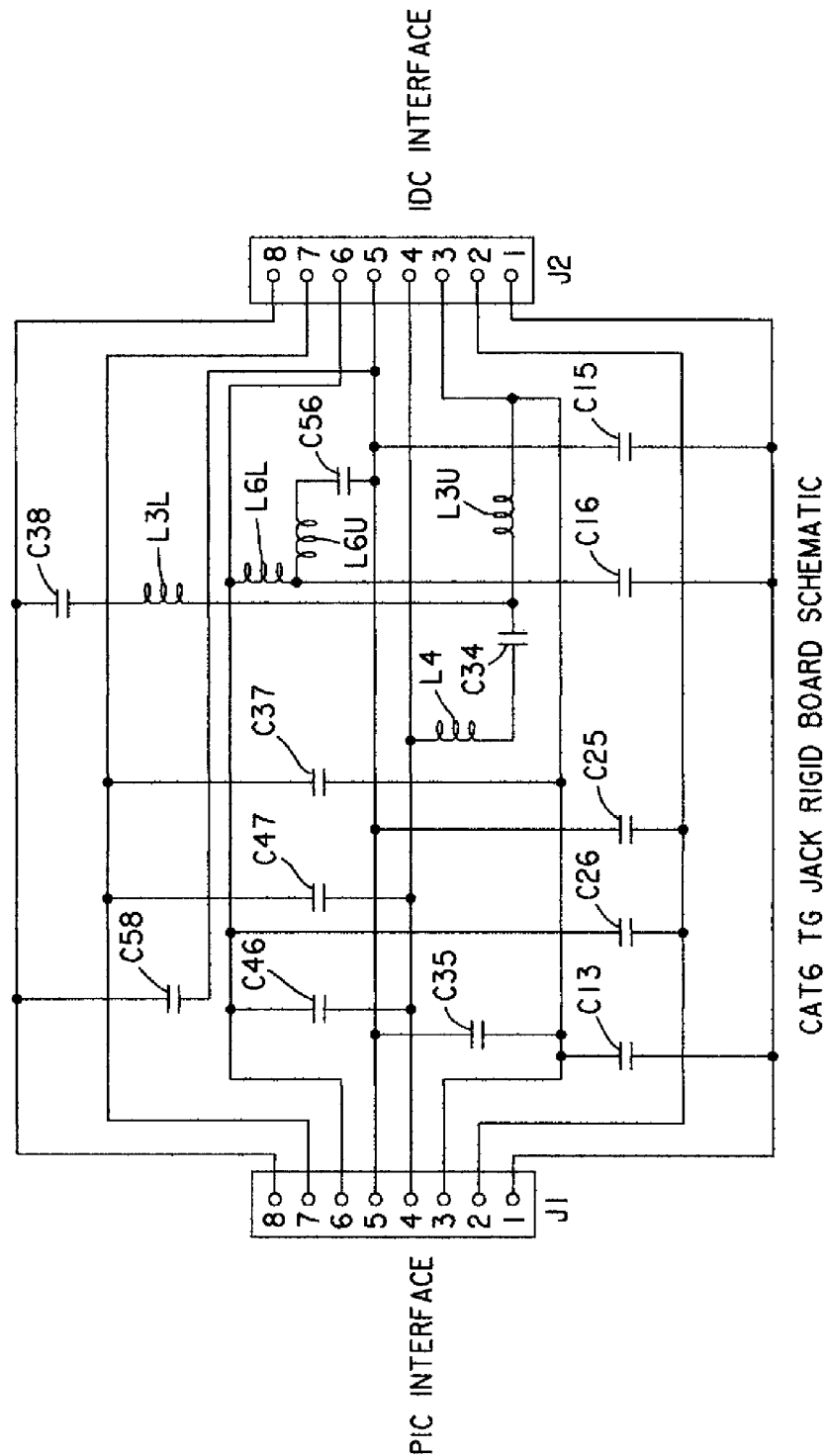
FIG. 2 is a schematic diagram of a printed circuit board according to one embodiment of the present invention.

Some embodiments of the present invention employ a PCB in a modular jack assembly 10, which includes two-stage capacitor compensation/crosstalk with time delay and a version of a "lattice network." More particularly, a PCB designed according to embodiments of the present invention may be employed as a rigid board 12 in a communication connector as shown in FIG. 1 and schematically in FIG. 2.

Other portions of the modular jack assembly 10 include the front housing 14, a contact nose 16 which holds plug interface contacts that are electrically connected to the rigid board 12, insulation displacement contacts (IDCs) 18 which terminate wires of a communication cable (not shown) and also make electrical contact with the rigid board 12, a rear housing 20, and a wiring cap 22. In a completed assembly, the plug interface contacts of the contact nose 16 and the IDCs 18 are inserted via compliant pins into the rigid board 12. The front housing 14 is clipped onto the rear housing 20, and the wiring cap 22 is clipped into the rear housing 20 thereby terminating wires of a communication cable at the IDCs 18.

The self-inductive stubs of the present invention employ the distributed electrical parameter of inductance per unit length of the circuit trace to produce the inductive elements. Although this configuration is modeled in the schematics below as a discrete inductor (which is appropriate as it has an equivalent effect) it is a distributed inductive component produced by the length of the traces as opposed to turns of a wire coil, for example. In contrast, the capacitors shown herein are discrete capacitors although both the capacitors and the inductors shown can be realized by discrete or distributed components, or as a combination thereof. The lattice network generally includes a crosstalk circuit component and a compensation circuit component, each of which has a different coupling rate versus frequency. A "crosstalk circuit component" is a circuit component in which coupling occurs with the same polarity as crosstalk-producing coupling within a plug, while a "compensation circuit component" is a circuit component in which coupling occurs in an opposite polarity to the crosstalk coupling that occurs within a plug.

Figure 3:
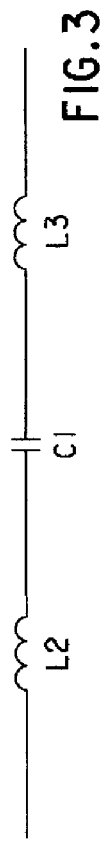
FIG. 3 is a schematic diagram of a capacitor placed between two inductors according to one embodiment of the invention.

The version of the lattice network used in embodiments of the present invention utilizes a second self-inductive stub connected between a capacitor and the second signal trace to the $2^{nd}$ stage crosstalk network. FIG. 3 illustrates a capacitor positioned between two inductors according to one embodiment of the present invention. Positioning the capacitor between the two stubs improves NEXT performance, relative to the opposite transmission direction (IDC to PIC), compared to putting the inductor on only one side of that capacitor, where the inductance of the single inductor, L1, is about equal to L2+L3 as shown in FIG. 3. Additionally, the second stub shows improvements in return loss, also relative to using only a one-sided inductor.

Self-inductive stubs (shown in FIG. 3) as described herein refer to traces that are made specific lengths to take advantage of their self-inductance. The term "stub" refers to the fact that these traces are not part of the main current-carrying path. They are stubs off of the current carrying path. Preferably, a self-inductive stub ends at a capacitor (i.e., there is no DC connection at the endpoint of the stubs). Current-carrying paths as described herein are traces that allow a DC current to flow between two points (such as the RJ45 plug and the insulation displacement contacts 18 (IDCs) in the jack).

EIA/TIA Category 6 ("CAT6") products generally have 8 wires that make up 4 differential pairs. These wires are numbered numerically 1 through 8, and the differential pairs are 45, 36, 12, and 78 (pairs 1, 2, 3, and 4, respectively). The layout of these wires within an RJ45 plug causes crosstalk between these differential pairs that must be compensated for within a jack. Since there are 4 differential pairs, near end crosstalk (NEXT) can form between the six different pair combinations. These pair combinations are 45-36, 45-12, 45-78, 36-12, 36-78, and 12-78.

Figure 4:
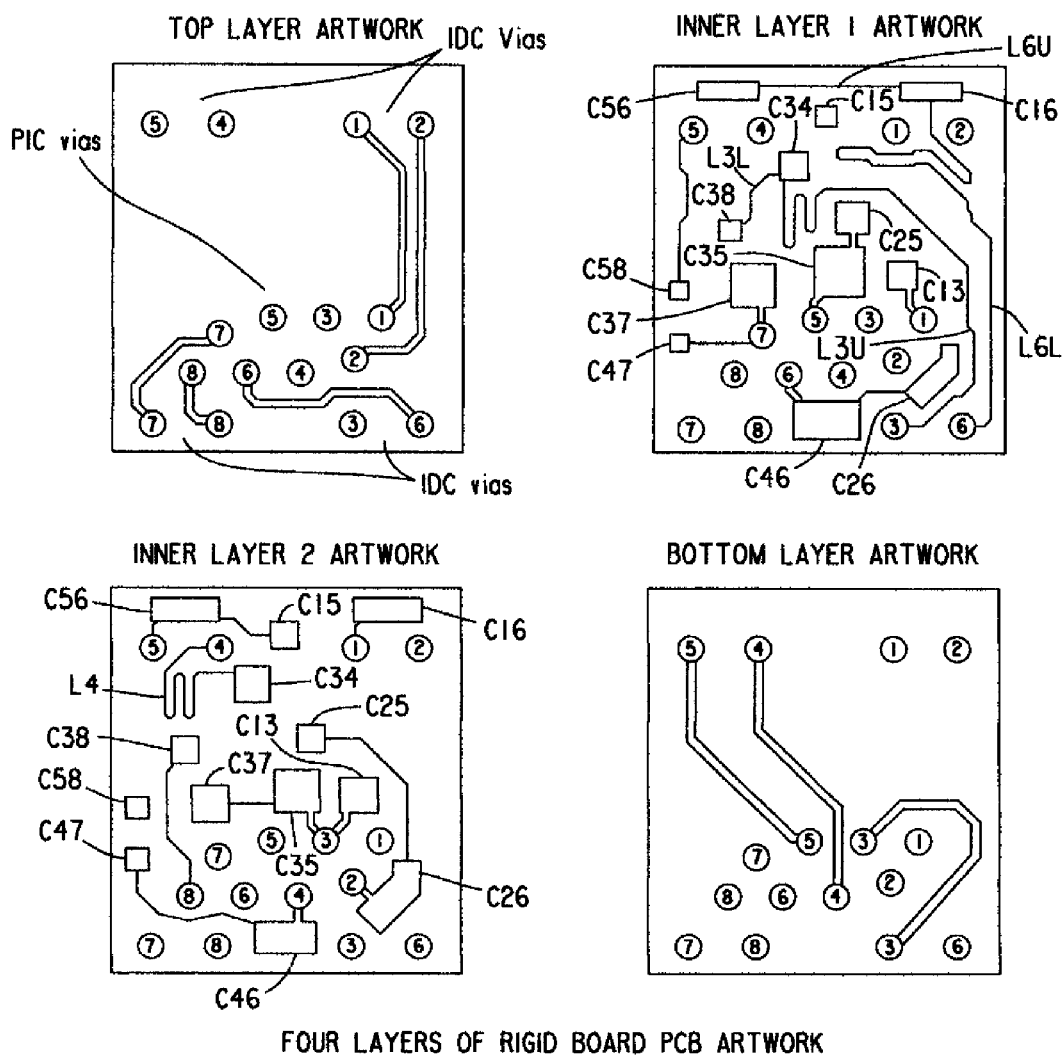
FIG. 4 shows plan views of conductive traces on layers of a printed circuit board according to one embodiment of the invention.
Figure 5:
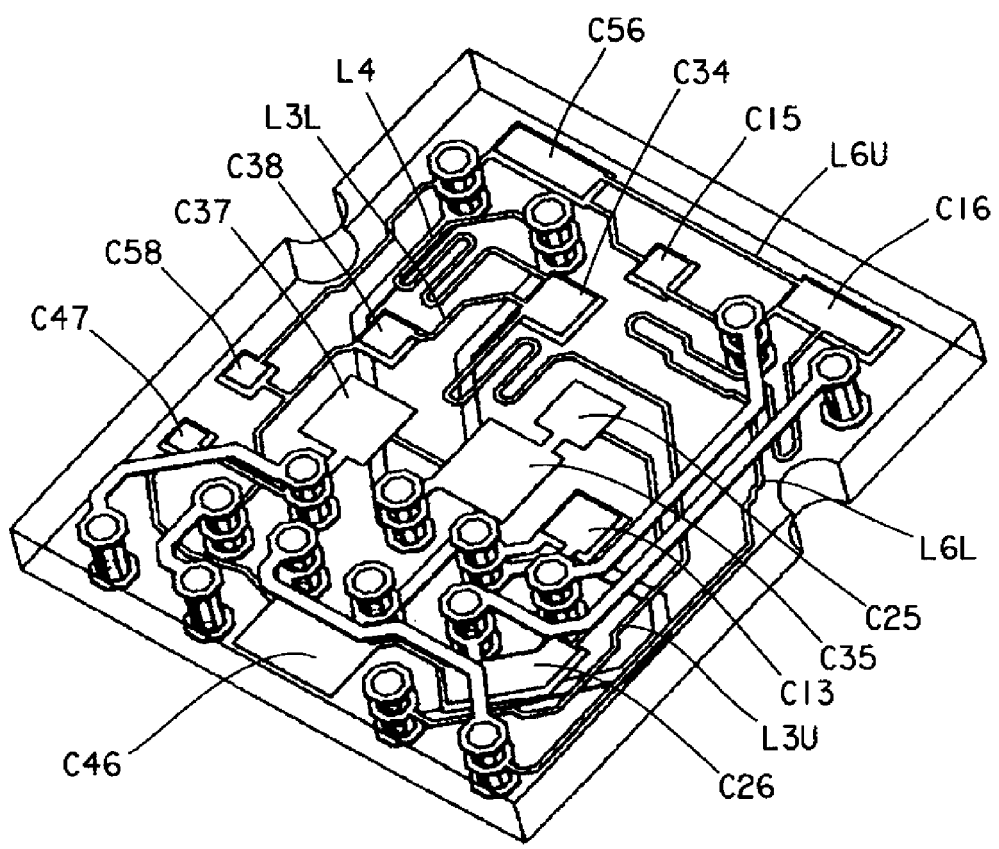
FIG. 5 is a perspective view showing conductive traces in a layered printed circuit board according to the embodiment of FIG. 4.
Figure 6:
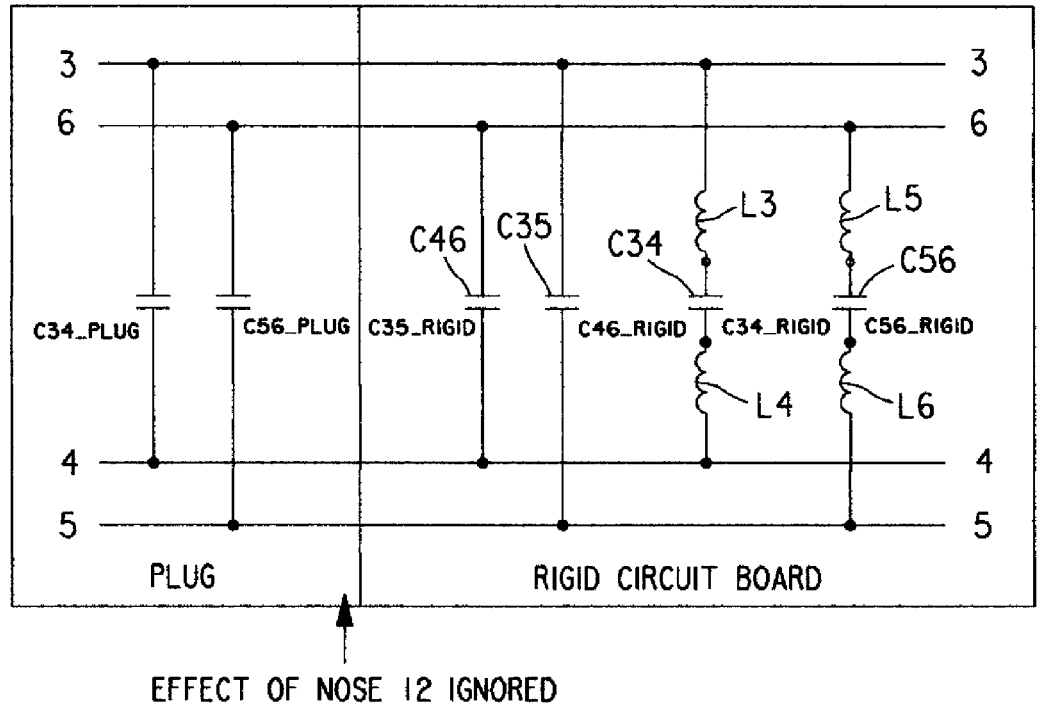
FIG. 6 is a schematic diagram showing a schematic for pair combination 45-36.

Referring to FIGS. 2, 4, and 5, the general design of a CAT6 jack according to one embodiment of the present invention uses time delay compensation for pair combinations 45-36, 36-12, 36-78, and 45-12. Pair combinations 45-36, 36-12, and 36-78 also make use of the lattice compensation technique. The type of lattice network for pair combination 45-36 described here is shown in FIG. 6. The lattice network here utilizes the self-inductance on C34 and C56 to create a "growing vector" in order to increase the overall NEXT bandwidth. Note that in FIG. 6, the effect of the nose 16 is ignored.

This description takes into account the following:

All capacitor dimensions given are referenced relative to the amount of overlap occurring between the pads. According to some embodiments of the present invention, one conductive pad of each capacitor is oversized 5 mils per side in each direction, for example, to help account for layer-to-layer registration. The dimensions given herein are for the smaller layer. According to one embodiment, capacitors are formed across a 4 mil core, generally made of an FR4 material having a dielectric constant of approximately 4.4.

The capacitance and inductance values given here are for use with one embodiment of an electrical connector. It is to be understood that the principles of the present application can be applied using other capacitance and inductance values. For example, different nose or IDC designs, including different material selection, may make alternative capacitance and inductance values beneficial.

Aspects of the present disclosure may be applied to shielded and/or punchdown-style connectors.

The schematics shown for each description include only the intentional capacitance added by design. For example, mutual inductance between wires is purposely not shown for schematic clarity and due to the fact that any mutual inductance that results from the design is not intentionally used for compensation.

These schematics do not show parasitic capacitances caused by the geometry of the setup unless this parasitic capacitance is deemed important to note (values greater than 0.1 pF). These values are noted, but not labeled with reference characters.

The schematics shown for each pair combination (FIGS. 6-11) do not show all connections since they are only showing two pairs at once. A full schematic of rigid board 12 is shown in FIG. 2. Note that for pair combinations 45-36, 36-12, and 36-78 the stub inductances are split between some of the capacitors. These connections are not completely shown in FIGS. 6-11 and the nomenclature for the inductance reflects which inductors are being used for which capacitors.

The schematics shown attempt to approximate a "middle plug" which refers to a plug whose crosstalk value is in the middle of the range of crosstalk specified for that pair combination.

All circuit board dimensions described in this RS are each individually subject to change (estimates up to 20%). One reason for this is variability of circuit board build tolerances from different circuit board manufacturers. Different material or different processes may be used to manufacture the circuit boards. Therefore, the performance of the circuit board may change even though the artwork is identical due to the capacitance changing. Another reason is to allow for design changes required to compensate for different jack designs that might be needed. Consequently, good engineering practice requires the ability to change the area of overlap for the pad capacitors by the specification tolerance (about ±20%). This change in area may be done on a capacitor-by-capacitor basis; however, it is preferred for the overall board design (trace layout, use of time delay, lattice) to remain constant even though capacitance values may be changed according to some embodiments. Some variants may only require changing the size of one or two capacitors (either smaller or larger), and some may require changing the size of all capacitors.

Referring to the Figures, and particularly to FIGS. 4 and 5, which show the individual rigid PCB layers' artwork and combined rigid PCB artwork, respectively, the PCB shown here has the following features. Dimensional tolerances for capacitive pads are given for both dimensions.

1. Current carrying traces are routed between PIC vias and IDC vias with the respective pin numbers. PIC vias refer to the vias where the compliant pins from nose 16 interface with the rigid circuit board 12 in FIG. 1. The IDC vias refer to the vias where the IDCs 18 interface with the rigid circuit board 12 in FIG. 1.

2. Improved manufacturability of the circuit board that has been achieved over previous CAT6 rigid circuit boards. This improved manufacturability has been achieved through moving capacitors further away from the vias so that they are less susceptible to manufacturing tolerances arising from layer-to-layer registration and tolerances in the drilling (such as capacitors C35 and C46 shown in FIGS. 4 and 5). Additionally, square capacitors are found to be less susceptible to manufacturing tolerances than rectangular capacitors, so most capacitors on the board have been made square.

Figure 7:
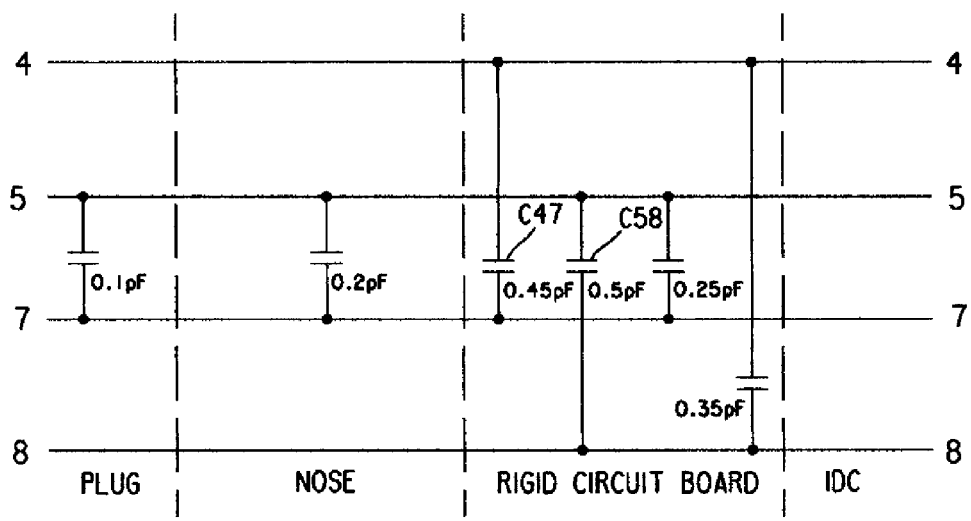
FIG. 7 is a schematic diagram showing a schematic for pair combination 45-78.

3. Crosstalk having the opposite polarity of the net crosstalk caused by the plug for pair combination 45-78 is provided by pad capacitor C47 connected between the 4 and 7 PIC vias, and by pad capacitor C58 connected between IDC via 5 and pin PIC via 8. A schematic for pair connection 45-78 is shown in FIG. 7. Pad capacitor C47 is sized 0.025" by 0.025" (±20%), and pad capacitor C58 is sized 0.027" by 0.027" (±20%).

Figure 8:
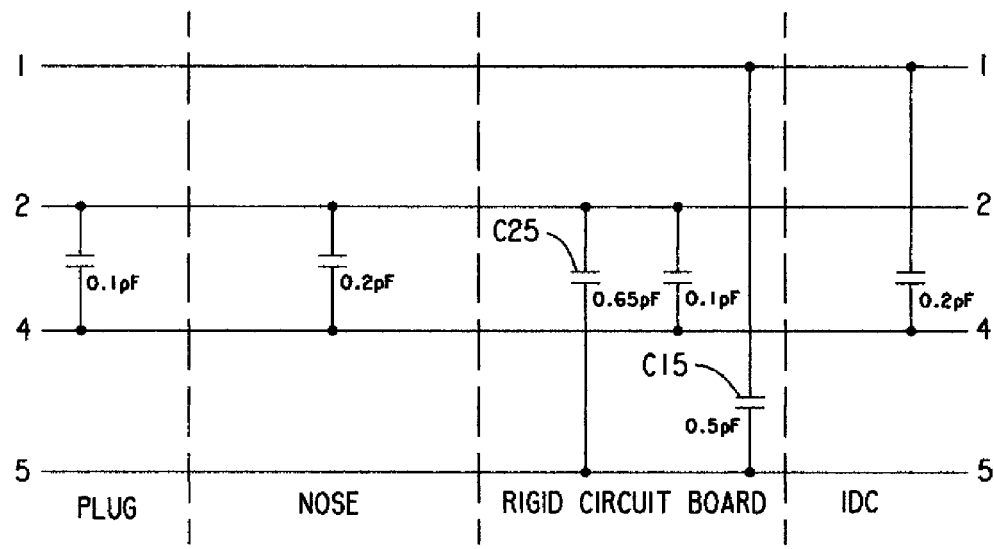
FIG. 8 is a schematic diagram showing a schematic for pair combination 45-12.

4. Crosstalk compensation for pair combination 45-12 is achieved by using the time delay model. A schematic for pair combination 45-12 is shown in FIG. 8. Pad capacitor C25 has the opposite polarity of the net crosstalk caused by the plug for pair combination 45-12 that connects between PIC vias 2 and 5. Pad capacitor C15 has the same polarity of the net crosstalk caused by the plug for pair combination 45-12 that connects between IDC vias 1 and 5. C15 is time delayed from C25 by approximately 0.395" (average distance between the 1, 2, 4, and 5 PIC vias to their respective IDC vias). Pad capacitor C25 is 0.042" by 0.042"±20%, and pad capacitor C15 is 0.033" by 0.033"±20%.

Figure 9:
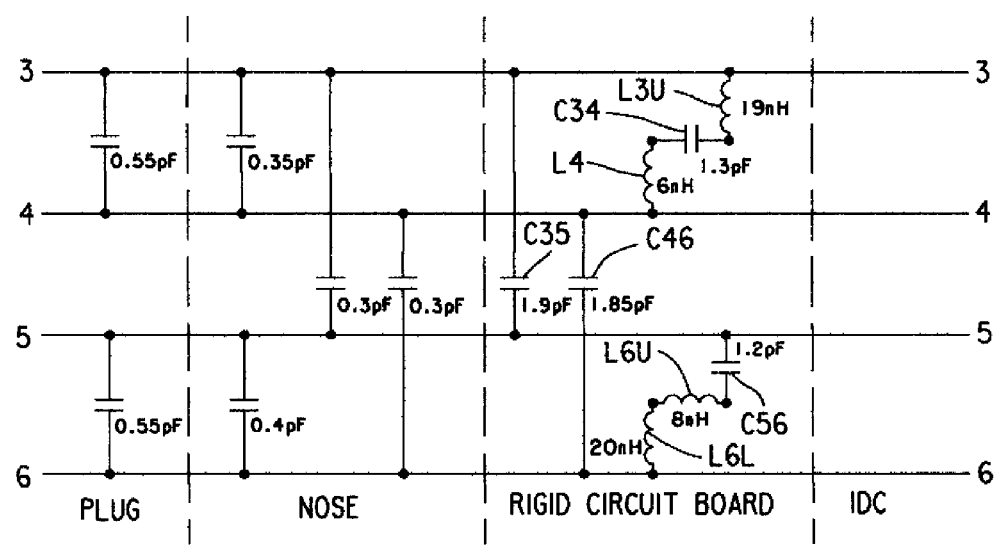
FIG. 9 is a schematic diagram showing a schematic for pair combination 45-36.
Figure 10:
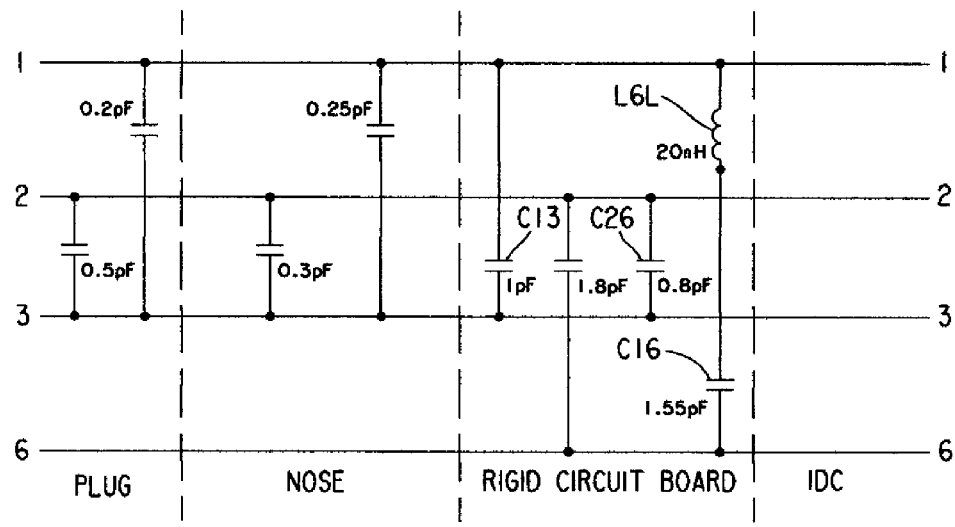
FIG. 10 is a schematic diagram showing a schematic for pair combination 36-12.
Figure 11:
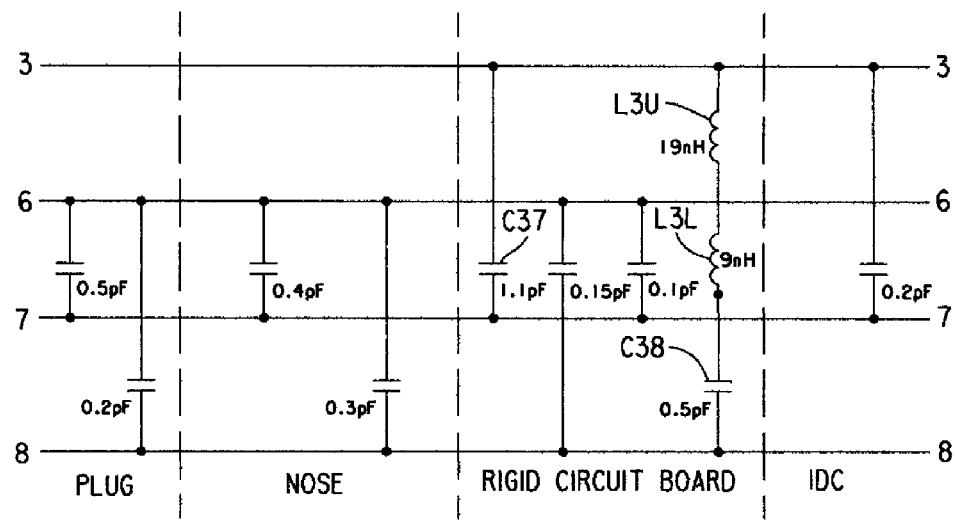
FIG. 11 is a schematic diagram showing a schematic for pair combination 45-36.

5. Crosstalk compensation for pair 45-36 is achieved by using the time delay model and by a lattice network compensation technique. A schematic for pair combination 45-36 is shown in FIG. 9. This time delay and lattice network includes:

a. A pad capacitor C35 connected between PIC vias 3 and 5 having the opposite polarity of the net crosstalk caused by the plug for pair combination 45-36. The pad capacitor C35 is 0.068" by 0.068"±20%.

b. A pad capacitor C46 is connected between PIC vias 4 and 6 having the opposite polarity of the net crosstalk caused by the plug for pair combination 45-36. The pad capacitor C46 is 0.050" by 0.093"±20%.

c. A pad capacitor C34 is connected between PIC vias 3 and 4 having the same polarity of the net crosstalk caused by the plug for pair combination 45-36. The pad capacitor C34 is 0.046" by 0.046"±20%. This capacitor is time delayed from the C35 and C46 capacitors by approximately 0.39" (the average distance between the 3, 4, 5, and 6 PIC vias to their respective IDC vias). The lattice network is achieved here by the addition of self-inductive stub L3U (approximately 0.9" in length) and another self-inductive stub L4 (approximately 0.5" in length).

d. A pad capacitor C56 having the same polarity of the net crosstalk caused by the plug for pair combination 45-36 that connects between IDC vias 5 and 6. The pad capacitor C56 is 0.0304" by 0.093"±20%. This capacitor is time delayed from the C35 and C46 capacitors by approximately 0.39" (average distance between the 3, 4, 5, and 6 PIC vias to their respective IDC vias). The lattice network is achieved here by the addition of self-inductive stub L6U and L6L (total length together of about 1.4"). Note that the self-inductance L5 is ignored due to the fact the stub length is minimal.
6. Crosstalk compensation for pair combination 36-12 is achieved by using the time delay model and by a lattice network compensation technique. A schematic for pair combination 36-12 is shown in FIG. 10. This time delay and lattice network includes:
   a. A pad capacitor C13 having opposite polarity of the net crosstalk caused by the plug for pair combination 36-12 that connects between PIC vias 1 and 3. The pad capacitor C13 is 0.046" by 0.046"±20%.
   b. A pad capacitor C26 having opposite polarity of the net crosstalk caused by the plug for pair combination 36-12 that connects between PIC vias 2 and 6. The pad capacitor C26 has an area of 0.00394 square inches ±44%.
   c. A pad capacitor C16 having the same polarity of the net crosstalk caused by the plug for pair combination 36-12 that connects between IDC vias 1 and 6. The pad capacitor C16 is 0.0335" by 0.0945"±20%. This capacitor is time delayed from the C13 and C26 capacitors by approximately 0.38" (the average distance between the 1, 2, 3, and 6 PIC vias to their respective IDC vias). The lattice network is achieved here by the addition of a self-inductive stub L6L (approximate length of 1") (this is the same L6L stub used by pad capacitor C56).
7. Crosstalk compensation for pair combination 36-78 is achieved by using the time delay model and by a lattice network compensation technique. A schematic for pair combination 36-78 is shown in FIG. 11. This time delay and lattice network includes:
   a. A pad capacitor C37 having opposite polarity of the net crosstalk caused by the plug for pair combination 36-78 that connects between PIC vias 3 and 7. The pad capacitor C37 is 0.058" by 0.058"±20%.
   b. A pad capacitor C38 having the same polarity of the net crosstalk caused by the plug for pair combination 36-78 that connects between IDC via 3 and PIC via 8. The pad capacitor C38 is 0.034" by 0.034"±20%. This capacitor is time delayed from the C37 capacitor by approximately 0.25" (average physical distance along the trace between the 3, 6, 7, and 8 PIC vias to their respective IDC vias). The lattice network is achieved here by the addition of self-inductive stub L3U and L3L (total length together of about 1.1") (this is the same L3U stub used by pad capacitor C34). Note that the self-inductance L8 is ignored due to the fact the stub length is minimal.

The self inductive stubs, along with corresponding capacitors (for example, the L5-056-L6 combination and L3-C34-L4 combination in FIG. 6), are an LC circuit with a resonance effect, having a resonant frequency if $f_o = 1/(2\pi\sqrt{LC})$. The selection of the inductance, L, and capacitance, C, values is generally a nonlinear multivariable optimization with multiple objective functions (NEXT, FEXT, return loss, etc.). Consequently, selection of a given L or C value is not made independent of other circuit considerations. Some of the considerations for selecting a given L value include that if it is too low the resonance point moves to a higher frequency and there may be no desired NEXT improvement in the signal frequency operation range of interest; and if the inductance is too high: a) the inductive traces can become to long to fit on a typical rigid board, b) the resonance can move into the frequency operation range of interest, possibly introducing deleterious effects; and c) there can be a degradation of return loss.

The invention claimed is:

1. A communication jack for use in a communication network, the jack comprising:
   a plurality of conductive pathways through the jack, the plurality of pathways comprising at least a first and second signal pair of conductive pathways, each signal pair comprising a first and second conductive pathway;
   a first stage of compensation circuitry, the first stage having a first capacitor connected between the second conductive pathway of the first signal pair and the first conductive pathway of the second signal pair and a second capacitor connected between the first conductive pathway of the first signal pair and the second conductive of the second signal pair; and
   a second stage of compensation circuitry, the second stage being time delayed and positioned further from a plug/jack interface than the first compensation stage, the second compensation stage having a third capacitor connected between the first conductive pathway of the first signal pair, and the first conductive pathway of the second signal pair, the third capacitor further being positioned between and in series with a first and second inductor.

2. The communication jack of claim 1 wherein the first and second inductors are inductive stubs, inductive stubs being a trace made of a specific length in order to take advantage of its self-inductance.

3. The communication jack of claim 2 wherein the second compensation stage also has a fourth capacitor, the fourth capacitor being connected between the second conductive pathway of the first signal pair and the second conductive pathway of the second signal pair, the fourth capacitor being in series with a third inductor, the third inductor being an inductive stub.

4. The communication jack of claim 3 wherein the second stage is time delayed from the first stage by a range of 0.25 to 0.395 inches.

5. The communication jack of claim 4 further comprising a third signal pair wherein the first compensation stage has a fifth capacitor connected between the first conductive pathway of the third signal pair and the first conductive pathway of the second signal pair, a sixth capacitor connected between the second conductive pathway of the third signal pair and the second conductive pathway of the second signal pair, a seventh capacitor connected between second conductive pathway of the third signal pair and the second conductive pathway of the first signal pair and wherein the second compensation stage has an eighth capacitor connected between the first conductive pathway of the fourth signal pair and the second conductive pathway of the first signal pair and a ninth capacitor connected between the first conductive pathway of the third signal pair and the second conductive pathway of the second signal pair, the ninth capacitor being in series with a fifth inductor, the fifth inductor being an inductive stub.

6. The communication jack of claim 5 further comprising a fourth signal pair wherein the first compensation stage also has a tenth capacitor connected between the first conductive pathway of the first signal pair and the first conductive pathway of the fourth signal pair, a eleventh capacitor connected between the second conductive pathway of the first signal pair and the second conductive pathway of the fourth signal pair, a twelfth capacitor connected between the first conductive path of the second signal pair and the first conductive path of the fourth signal pair and wherein the second compensation stage has a thirteenth capacitor connected between the first conductive path of the second signal pair and the second conductive path of the fourth signal pair, the eleventh capacitor in series with a fifth inductor, the fifth inductor being an inductive stub.

* * * * *